United States Patent [19]

Bland et al.

[11] Patent Number: 4,494,171
[45] Date of Patent: Jan. 15, 1985

[54] IMPINGEMENT COOLING APPARATUS FOR HEAT LIBERATING DEVICE

[75] Inventors: Timothy J. Bland; Richard E. Niggemann, both of Rockford, Ill.

[73] Assignee: Sundstrand Corporation, Rockford, Ill.

[21] Appl. No.: 411,059

[22] Filed: Aug. 24, 1982

[51] Int. Cl.³ .............................................. H05K 7/20
[52] U.S. Cl. .................... 361/386; 361/384; 361/385; 165/DIG. 11
[58] Field of Search ............... 357/82; 165/DIG. 11, 165/109 R; 174/15 R, 16 HS; 361/381-388

[56] References Cited

U.S. PATENT DOCUMENTS

| | | | |
|---|---|---|---|
| 3,457,988 | 7/1969 | Meyerhoff | 357/82 |
| 3,908,188 | 9/1975 | Kawamoto | 357/82 |
| 4,093,021 | 6/1978 | Groom | 361/384 |
| 4,188,996 | 2/1980 | Pellant | 357/82 |
| 4,258,383 | 3/1981 | Kessler, Jr. | 357/82 |
| 4,296,455 | 10/1981 | Leaycraft | 174/16 HS |
| 4,399,484 | 8/1983 | Mayer | 165/DIG. 11 |

FOREIGN PATENT DOCUMENTS

1451246  3/1969  Fed. Rep. of Germany ... 165/DIG. 11

Primary Examiner—G. P. Tolin
Attorney, Agent, or Firm—Harold A. Williamson; Ted E. Killingsworth; Michael B. McMurry

[57] ABSTRACT

The present invention relates to an impingement cooling apparatus for use in the removal of heat from a heat liberating device. The apparatus includes a housing on which the device is secured and a stack of plates fitted within the housing. One of the plates is an impingement orifice plate adjacent the housing where the device is located. The orifice plate has a region that is characterized by coolant flow impingement orifices passing therethrough. The orifice plate also has a coolant drainage return adjacent the impingement orifice region.

33 Claims, 23 Drawing Figures

IMPINGEMENT COOLING APPARATUS FOR HEAT LIBERATING DEVICE

TECHNICAL FIELD

The invention relates to an impingement cooling apparatus for the removal of dissipated heat at high heat fluxes from a heat liberating device.

BACKGROUND ART

As a general proposition it may be fairly stated that over the years the field of electronic components has experienced a continuous reduction in component size while simultaneously calling upon these components to handle increasingly greater levels of power. An oversimplification would be to say that smaller size and increased power levels result in higher operating temperatures for the electronic components. The presence of elevated temperatures of the electronic component is attended by a variety of operational difficulties and malfunctions, all of which are temperature related.

In the use of a solid state component or device, the presence of high power levels results in high temperature operation which causes distortions in the operating characteristics of the device. In the worst case situation, absent the removal of the heat liberated during such operation, a complete failure of the component or device will occur.

Distortions or deformations in physical parameters of such devices as laser mirrors used in conjunction with high energy laser beams is yet another technical area where there is an uncommonly high level of energy in a small area that must be removed, least unwanted deformations in the mirror occur due to heat liberated by the laser beams cooperation with the reflective surface of the mirror.

When the device to be cooled is in the form of a mirror there are technical considerations in respect of the total physical nature of the mirror that must be taken into account. These considerations are such as, but not limited to the desirability of (1) the mirror being capable of handling increased laser power, (2) a reduced level of vibration to the mirror surface induced by whatever means are used to cool the mirror, and (3) mirror face plate temperature uniformity.

Also to be considered in a mirror environment are such additional considerations as mirror wedging, a phenomena induced by the presence of a temperature gradient along the face of mirror face plate, as well as a deformation termed inter-actuator bowing which is purportedly due to a face plate temperature rise over a substrate upon which the mirror is positioned.

The invention to be described more fully hereinafter is especially useful as a means for providing cooling for a heat liberating device such as a high power laser mirror. The problem of removing large quantities of heat from a small area is also encountered in the prior art systems for cooling electronic circuits. A review of the prior art has uncovered a number of cooling systems and cooling apparatus, that taken collectively, establish a background against which the invention to be described, advantageously departs from and will be defined over. In view of the fact that the invention to be described in this specification deals with impingement cooling, the prior art set forth next and then distinguished over, will all be of the type where at least some facet of the cooling apparatus utilizes impingement cooling of a heat liberating device.

The patent to P. G. Ross, U.S. Pat. No. 3,400,543 is directed to a semi-conductor cooling means which utilizes a fluid injection system to cool the base member of a transistor. Ross employes, as seen in FIG. 2, a single jet of coolant delivered through an injection tube 44 to the base of a semi-conductor 10. Ross has a fluid return means 54 (FIG. 1) which receives coolant after impingement. Ross does not provide, as does the invention of this specification, for arrays of submerged fluid jets, nor an arrangement of stacked heat conducting plates designed to provide an array of submerged jets and coolant delivery and drainage means integrally formed by the plates in combination with a housing upon which the device to be cooled is mounted.

The next three patents to R. M. Hruda, U.S. Pat. No. 3,414,753, H. Kawamoto, U.S. Pat. No. 3,908,188 and S. W. Kessler, U.S. Pat. No. 4,258,383 to be reviewed, suffer from the same deficiencies noted in respect of Ross above.

Accordingly, we see in R. M. Hruda, the removal of vaporized cooling liquid from heat exchange elements by power jets. Hruda provides a plurality of vertically disposed pipes 28 having openings 49 through which coolant is directed towards an anode or target element 16 submerged in the coolant. The impingement jets from openings 40 break up a vapor layer on element 16 formed in boiling heat transfer.

The patent to Kawamoto is directed to an individual heat sink for a solid state element and employs a single impingement jet 8 directed at the base of the solid state element.

The patent to S. W. Kessler is directed to a minimum pressure drop liquid cooled structure for a semiconductor device. Kessler teaches a technique to optimize heat transfer to effect cooling and pressure drop for radial flow across a flat surface. A conduit 36 delivers coolant in a direction normal to the surface from which heat is to be removed. At the end of conduit 36 there is provided a flange 42 that has a frustoconical face 50 formed thereon to thereby allow coolant to be directed towards the surface to be cooled while optimizing pressure drop for the radial flow across the surface to be cooled.

The patent to E. C. Leaycraft, U.S. Pat. No. 4,296,455 is directed to slotted heat sinks for high powered air cooled modules. Leaycraft provides for a parallel air flow of large volume to be directed through openings 18 in a plate 17 to impinge directly onto an integrated circuit module 10. Although Leaycraft characterizes the flow as impinging, the size of the openings 18 which are nearly the same size as the component to be cooled would more aptly be considered area cooling rather than impingement cooling of the jet type described in the patents reviewed hereinbefore.

Leaycraft does not suggest as does the invention to be described, the provision of submerged fluid jets arranged in an array that envolves a heat conducting fin like structure coupled to the device to be cooled, the fins having orifices therein positioned such that coolant delivered to and through the fin orifices creates the submerged array of jets that allow the removal of heat from the fins which in turn provide for cooling of the device.

DISCLOSURE OF THE INVENTION

The present invention relates in its broadest form, to an impingement cooling apparatus for use in the removal of dissipated heat, at high heat fluxes from a heat liberating device. The apparatus includes a housing which has an end thereof in intimate contact with the device to be cooled. A stack of plates are fitted within the housing. One of the plates is an impingement orifice plate adjacent the end of the housing where the device is located. The orifice plate has a region designated as an impingement orifice region, which region is characterized by coolant flow impingement orifices passing therethrough. The orifice plate also has a coolant drainage return opening adjacent the impingement orifice region.

The remaining plates of the stack are positioned adjacent the orifice plate and between the orifice plate and a coolant inlet and a drainage outlet. Each of the plates of the stack have at least one opening therethrough. Each opening cooperates with the opening on an adjacent plate to form an inlet channel between the coolant inlet and the orifice plate to thereby allow the establishment of a coolant flow path to the orifice plate which allows for the supply of coolant through the orifice to impinge upon the end of the housing to provide impingement cooling of the heat liberating device.

The coolant is returned through the coolant drainage return channel adjacent the impingement orifice regions and a return channel from the orifice plate to the drainage outlet, whereby a drainage flow path is established, such that coolant after impinging upon the end of the housing passes back past the stack of plates to the drainage outlet and is free from cross-flow with the coolant flow path delivered through the inlet channel to the impingement plate to thereby provide maximum heat transfer from the device to the coolant.

The invention in a more specific form relates to an impingement cooling apparatus for a heat liberating device, wherein the apparatus includes an axially stacked series of heat transfer surface fins, thermally coupled to the device.

Each of the fins has at least one orifice passing therethrough. The fin orifices are each in non-aligned relationship with the orifice of an adjacent fin.

Coolant is provided to and through the fin orifices to thereby cause the coolant passing through the orifices to impinge upon the next fin encountered in the direction of coolant flow and thereby establish a structure having very high thermal conductance and which allows operation of the device at high heat fluxes for a given temperature drop between the device and the coolant.

A thermally conductive housing surrounds the stacked series of heat transfer surface fins. The housing has an internal end in intimate contact with an end of the axially stacked fins. The device to be cooled is secured externally of the housing to the same end of the housing as that which the axially stacked fins makes the aforementioned intimate contact.

It is therefore a primary object of this invention to provide an impingement cooling apparatus for use in the removal of dissipated heat, at high heat fluxes from a high heat liberating device by means of a heat conducting stack of plates designed to provide an array of submerged jets and a coolant delivery and drainage means integrally formed by the plates, and a housing upon which the device to be cooled is mounted.

Another object of this invention is a cooling apparatus that is readily fabricated in the configuration of stacked plates within a housing such that any number of plates may be provided with impingement orifices whereby coolant delivered to and through mating openings in adjacent plates will pass through the orifices and provide impingement cooling to the next succeeding heat conducting surface encountered.

Yet another object of the invention is to provide an impingement cooling apparatus for a heat liberating device wherein there is employed a primary heat transmitting element respectively coupled to the device, and a structure having a plurality of parallel surfaces wherein a source of fluid coolant is delivered to the surfaces in the form of impinging jets by way of arrays of submerged fluid jets which flow onto the surfaces and through orifices within the surfaces to thereby provide for the removal of heat liberated from the device.

In the attainment of the foregoing objects, the invention contemplates in one embodiment that the cooling apparatus take the form of a hermetically sealed thermally conductive housing. The housing has an end thereof in intimate contact with the device to be cooled and has therein a stack of plates.

One of the plates adjacent the end of the housing where the device to be cooled is externally located is designated an orifice plate, and is characterized by an impingement orifice region wherein coolant flow impingement orifices pass therethrough. The orifice plate is additionally provided with a coolant drainage return port adjacent the impingement orifice region.

The remaining plates are positioned adjacent the orifice plate and a coolant inlet and a drainage outlet. Each of the remaining plates is provided with more than one opening on an adjacent plate to form an inlet channel between the coolant inlet and the orifice plate impingement region, to thereby allow the establishment of a coolant flow path to the orifice plate whereby coolant is supplied through the orifice to impinge upon the internal end of the housing to provide impingement cooling of the heat liberating device that is in intimate contact with the external end of the housing.

The coolant is thereafter returned through the coolant drainage return port in the orifice plate and through another set of openings in the other adjacent plates that cooperate to form a return channel from the orifice plate to the drainage outlet, whereby a drainage flow path is established, such that coolant after impinging upon the end of the housing passes back through the stack of plates to the drainage outlet. This drainage flow path is free from cross-flow with the coolant flow path that is delivered through the channel to the impingement orifice plate and provides maximum heat transfer from the device to the coolant.

The unique stacked plate arrangement described allows for variations in the invention in that in respect of the apparatus just described, one may elect to have one of the remaining plates in the stack be an additional or another impingement orifice plate. This other orifice plate is similar to the orifice plate described in that it has an impingement orifice region with orifices that have coolant passing therethrough.

It is significant to the invention to note, however, that the orifices in the respective orifice plates just described are in non-aligned relationship. The additional or other impingement plate is also provided with a coolant drainage return port adjacent the impingement region.

A spacer plate is disposed between the impingement orifice plates. The spacer plate has openings therethrough which are cooperatively disposed to allow coolant to pass freely from the impingement orifice of the additional or other impingement plate to the impingement orifice region of the first recited impingement orifice plate.

The spacer plate is characterized by having another opening therethrough, which opening is a drainage opening which is cooperatively disposed to allow coolant to be returned through the coolant drainage ports of the orifice plates and the spacer plate drainage opening.

The spacer plates have what is termed spacer plate heat conduction zones between the openings. These spacer plate heat conduction zones provide a heat conduction path from one side of the spacer plate to another side thereof.

The end of the housing has internally raised portions which physically cooperate with an impingement plate heat conduction zone, to be described more fully hereinafter, of the just mentioned impingement orifice plates.

The impingement orifice plates each have impingement plate heat conduction zones between the impingement orifice regions. The impingement plate heat conduction zones are in alignment with the raised portions of the internal end of the housing, as well as the spacer plate heat conduction zones.

At least one of the raised portions of the housing is thermally coupled to the impingement plate heat conduction zones of the adjacent orifice plate to thereby allow heat paths to be developed from the housing end through the raised portions, the impingement plate heat conduction zones, and the spacer plate heat conduction zones, whereby heat liberated by the device is removed by the impingement of the coolant on at least the just recited orifice plate and by impingement of coolant upon the housing end.

From the structure just described, it can be seen that each orifice plate and spacer plate represent an additional heat transfer surface arrangement.

The invention contemplates multiple spacer orifice plate arrangements which will be described in detail hereinafter.

Other objects and advantages of the present invention will be apparent upon reference to the accompanying description when taken in conjunction with the following drawings.

BEST MODE FOR CARRYING OUT THE INVENTION

Before reference is made to the drawings the following thoughts are offered in respect of heat exchangers in general. The two fundamental heat transfer processes used in most heat exchangers are conduction through metal and convection from a surface to a fluid. The temperature drop associated with conduction heating through a solid is proportional to the heat transport length, l, and inversely proportional to the thermal conductivity, k, of the metal. Associated with convection is a temperature drop from the surface to a coolant fluid that is inversely proportional to the fluid heat transfer coefficient, h. It is obvious that in order to minimize temperature drop, a large surface area should be used with a high value of h, a high value of thermal conductivity, k, and a low conduction length, l. Clearly, the large surface area and the low value of conduction length are somewhat incompatible. Where fins are used to cool, only a small portion of the extended surface area of the fins is useful due to the conduction temperature drop in the fins. Thus, very high intensity heat transfer requires a structure that has high heat transfer coefficients combined with lots of surface area that is conductively coupled to the heat absorbing surface with a high conductivity metal through a very short conduction path. The invention to be described hereinafter combines all these just recited positive features in a compact high intensity cooler 11 shown in FIG. 1. From time to time hereinafter, the acronym CHIC which is derived from the first letter of each word of the phrase "compact high intensity cooler" will be used.

Figure 1:
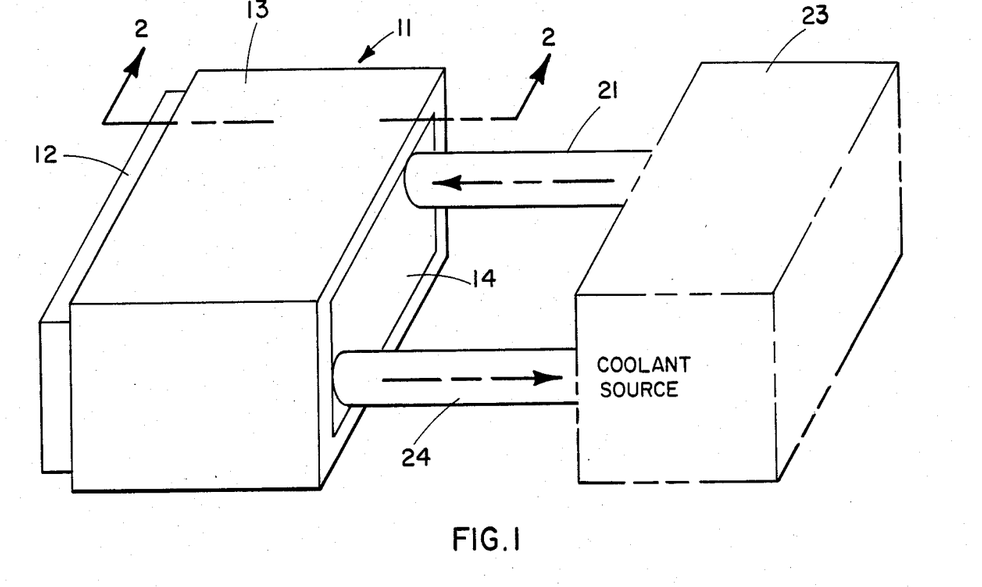
FIG. 1 is a three dimensional illustration of the external configuration of a compact high intensity cooler which embodies the invention shown in conjunction with a source of coolant.

Reference is now made to FIG. 1 in which there is illustrated as just noted, a compact high intensity cooler 11 shown in three dimensional form in the shape of a cube. This cube shape is but one of a multitude of configurations that the invention to be described more fully hereinafter may take. The CHIC 11 has shown at its left hand end a heat liberating device 12, which heat liberating device 12 may be an electronic component or a heat liberating device such as the surface of a mirror. The CHIC 11 has a housing 13 provided with an end cap 14. A coolant source 23 is shown in dotted outline to the right of the CHIC 11 and is shown coupled to the end cap 14 via a coolant inlet tube 21 and a coolant drainage tube 24.

Figure 2:
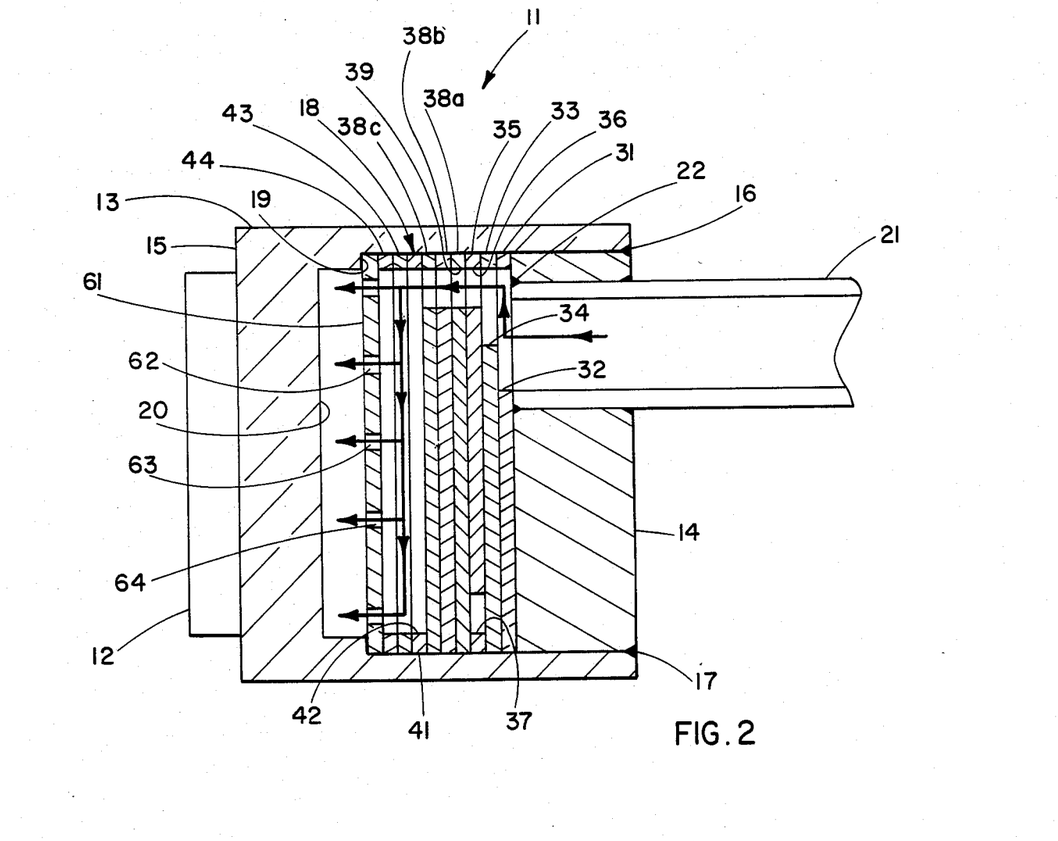
FIG. 2 is a cross section taken along the line 2—2 in FIG. 1.

Attention is now directed to FIG. 2 in which there is shown a cross-sectional view taken along 2—2 in FIG. 1. Again it will be noted that the compact high intensity cooler 11 is provided with a housing 13 with an end cap 14 shown brazed or soldered in place as indicated by reference numerals 16-17. The housing 13 is typically formed of a thermally conductive material such as copper. The device to be cooled, 12, is shown secured to the end 15 of the housing 13. In practice, the surface 15 may be lapped flat and the device 12 soldered thereto or held in intimate contact with thermally conductive grease. In the event a mirror of the type used in conjunction with a laser beam were involved, then the reflective surface of the mirror could be bonded direct to the surface 15. At the left hand end of the housing 13 there is designated an internal surface or end of the housing 20. The end of the housing on which the heat liberating device is located is a primary heat transmitting means. The internal end of the housing of the primary heat transmitting means takes on a different configuration as will be seen in the description of the subsequent figures of the specification. Between the end of the housing 20 and the cap 14 there is shown positioned a stack of plates 18 which in this embodiment take on a square shaped configuration. The stack of plates 18 are fitted against a shoulder 19 of the housing 13. The stack of plates 18 is held in place against the shoulder 19 by means of the cap 14 which has been, as noted above, soldered or brazed at point 16-17 to the housing 13. An inlet tube 21 passes through the cap 14 and is shown brazed in place at point 22. It is to be understood that while FIG. 2 does not show the drainage tube 24, because the nature of the section taken, the drainage tube 24 is also brazed or soldered in place after passing through the cap 14 much in the same manner as the inlet tube 21 which has been secured to the cap 14 as described. The arrangement just described provides for a hermetically sealed housing.

Figure 5:
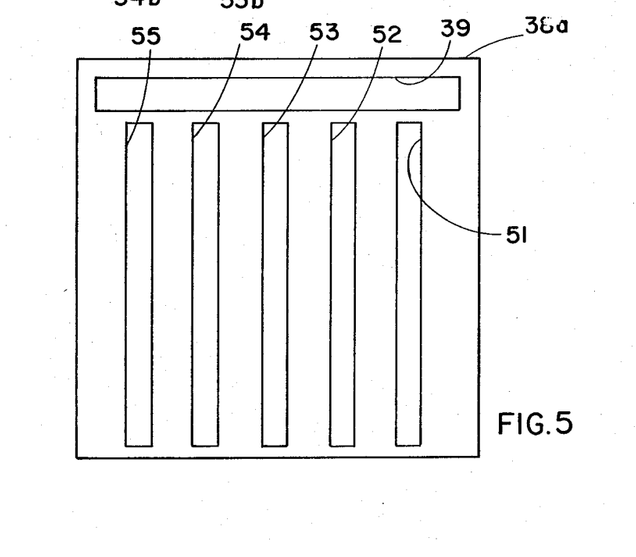
FIG. 5 is a front view of yet another plate used in the fabrication of the compact high intensity cooler shown in section in FIG. 2.
Figure 6:
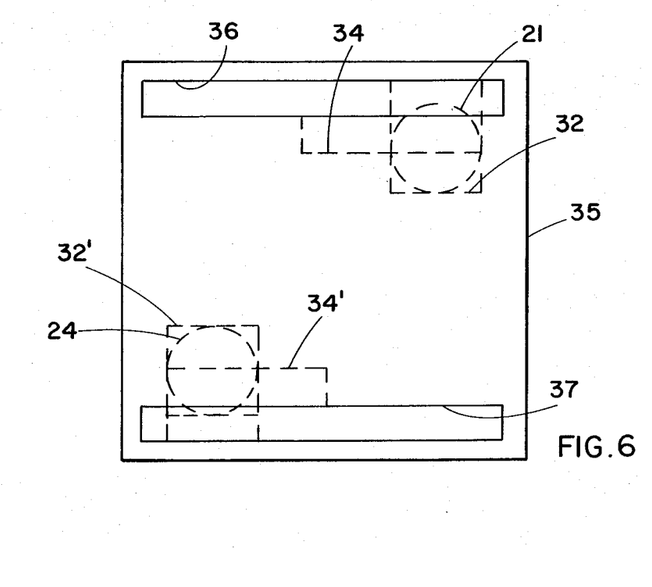
FIG. 6 is a front view of still yet another plate employed in the fabrication of the compact high intensity cooler shown in section in FIG. 2.

Attention now will be directed to the stack of plates 18 and the nature with which they cooperate one with each other and as a whole provide a unique means for fabricating coolant flow and drainage paths in the compact high intensity cooler 11 now being described. In order to better appreciate the structure of the plates 18 and the manner in which the openings in the plates cooperate one with the other, the reader should study in conjunction with FIG. 2 the illustrations of FIGS. 3, 4, 5 and 6. Each of these FIGS. 3 through 6 provide the details of construction of a different type of plate used within the stack of plates 18. Directing ones attention to FIG. 2, it will be seen that adjacent the inlet tube 21 there are shown a plate 31 and a plate 33. Separate front holes of plates 31 and 33 are not illustrated in FIGS. 3 through 6, however, the openings in these plates designated as square inlet transition slot 32 and rectangular inlet transition slot 34 may be seen in FIG. 6 shown in dotted outline in the upper right hand corner of FIG. 6. The inlet tube 21 is also shown in dotted outline in FIG. 6. Each of the transition plates 31, 33 have diagonally disposed respective square drainage transition slot 32' and rectangular drainage transition slot 34'. It is believed that the cooperation of the transition slots 32, 34 is readily apparent in that coolant passing through inlet tube 21 is forced first through the square opening 32 in transition plate 31, and then through a rectangular slot 34 in plate 33. The next plate to the left of transition plate 33 is designated a feed and return slot plate 35. This plate can be seen in FIG. 6 where feed slot 36 and return slot 37 are shown in full line. The next succeeding plate to the left of the feed and return slot plate 35 is designated an inlet feed slot and drainage slot plate. In this embodiment of the invention there are three such feed slot and drainage slot plates designated 38A, 38B and 38C. The inlet feed slot and drainage slot plate 38A is shown in FIG. 5 wherein there is depicted horizontally disposed as FIG. 5 and viewed an inlet slot 39. At right angles to the slot 39 and spaced apart therefrom are drainage slots 51, 52, 53, 54 and 55. Each of the plates 38A, 38B and 38C are identical in their slot configurations and when the plates are stacked together the slots therein cooperate to provide flow paths through the openings 51, 52, 53, 54 and 55.

Figure 3:
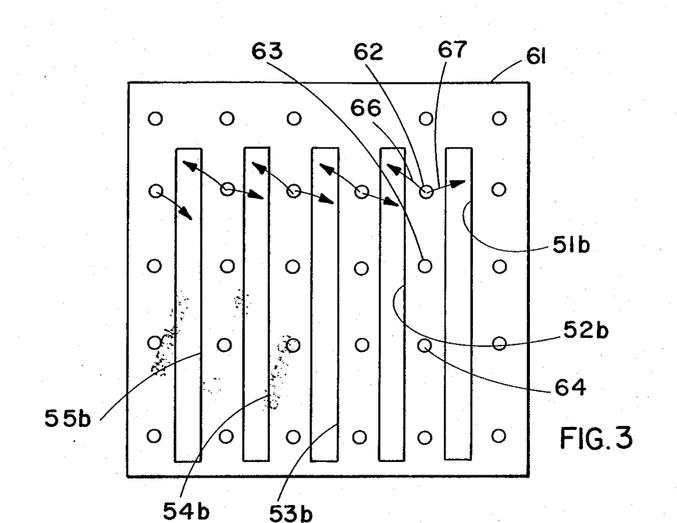
FIG. 3 is a front view of one form of an impingement orifice plate shown in section in FIG. 2.
Figure 4:
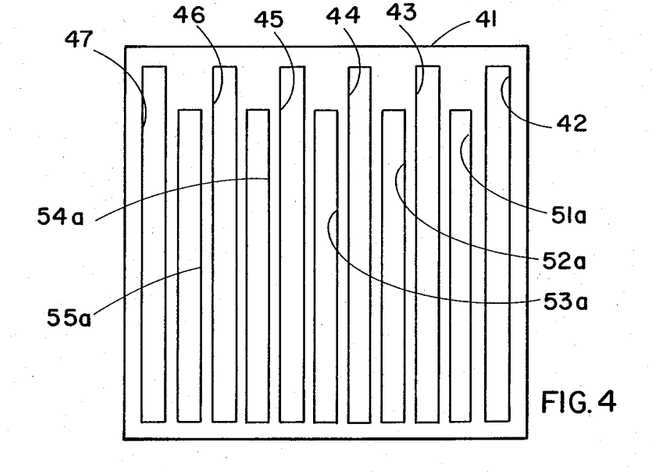
FIG. 4 is a front view of one form of spacer plate used in the fabrication of compact high intensity cooler shown in section in FIG. 2.

Proceeding to the left in the description of the slots in the stack of plates 18 we find distribution plate 41 which has a front view thereof in FIG. 4. The distribution plate 41 is characterized by having in addition to drainage slots 51A, 52A, 53A, 54A, 55A, distribution slots 42, 43, 44, 45, 46 and 47. The next two plates 43 and 44 are plates having the same configuration as the distribution plate 41 just described in respect of FIG. 4. An impingement orifice plate 61 adjacent the internal end 20 of the housing 13 represents the last plate in the stack. The impingement orifice plate 61 is shown in FIG. 3. The impingement orifice plate 61 as seen in FIG. 3 is provided with an array of orifices of a type designated by reference numerals 62, 63 and 64. The impingement orifice plate 61 is also provided with drainage slots 51B, 52B, 53B, 54B and 55B.

The plates of stack 18 are about 0.010 inches thick, are made of copper and are diffusion bonded one to another and to the cap 14 prior to insertion into the housing 13. The liquid flow paths to be described next, which flow paths are formed through the openings in the plates of stack 18, are manufactured by chemically milling slots or holes in copper sheets from which the plates are constructed prior to the plates being bonded together. The impingement orifices 62, 63, 64 which are representative of the other unreferenced orifices in the impingement orifice plate 61 are distributed across the plate 61 to provide a uniform cooling arrangement. The selection of the number and size of these holes or orifices is based on an allowable pressure drop and manufacturing capability. A large number of small holes is preferable.

The operation of the CHIC 11 of FIGS. 1 and 2 is as follows. Coolant under pressure from the source 23 is delivered via an inlet tube 21 to and through the cap 14 as shown in FIG. 2. The inlet tube 21 is provided with a filter screen not shown. Coolant under pressure upon emerging from the inlet tube 21 enters the square shaped opening 32 in transition plate 31, and is thereafter directed through rectangular opening 34 in transition plate 33, where it thereafter enters the top feed slot 36 of return and feed slot plate 35. Coolant emerging from top feed slot 36 enters a series of top feed slots such as 39 in inlet feed slot and drainage slot plates 38A, 38B and 38C where it is delivered to and through the distribution slots 42, 43, 44, 45, 46 and 47 of the distribution plate 41. From these distribution slots just enumerated, the coolant passes through the orifices in the impingement orifice plate 61 and impinge upon the internal end 20 of the housing 13 thereby removing heat conducted from the heat liberated device 12 through the end of the housing 15.

In FIG. 3 reference numerals 66 and 67 designate impingement coolant flow arrows emanating from, for example, the orifice 62. The coolant after impinging on the internal end 20 of the housing 13 follows the path of the arrows 66, 67 and enters the drainage slots 51B and 52B, which in turn allow the coolant to pass back through the channel created by the stacked arrangement of cooperating slot openings 51A, 52A, 53A, 54A and 51, 52, 53, 54 and 55. During this return passing of the coolant, it will be observed that the coolant is free from cross-flow with the coolant flow path described earlier with respect to the delivery of the coolant through the stack plate arrangement to the orifice impingement plate 61. The return coolant then passes through the bottom distribution slot 37 of the feed and return plate 35 and commences a transition through slots 34', 42' and finally enters coolant drainage tube 24 for return to the coolant source 23.

Reference is now made to FIGS. 7 through 12, which figures illustrate in a variety of cross-sections a preferred embodiment of the invention. The explanation that follows the readers attention will be simultaneously directed to the various figures, as this will be necessary for the reader to comprehend the arrangement of the elements and their cooperation which defines the operation of the invention.

Figure 7:
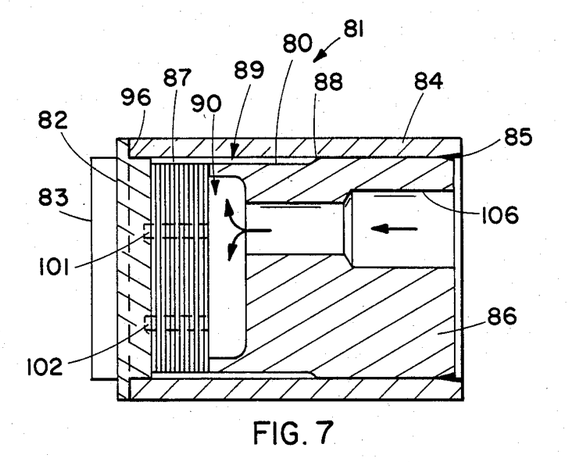
FIG. 7 is a cross-section taken along line 7—7 in FIG. 8 of a multiple impingement plate compact high intensity cooler and represents the preferred embodiment of the invention.
Figure 11:
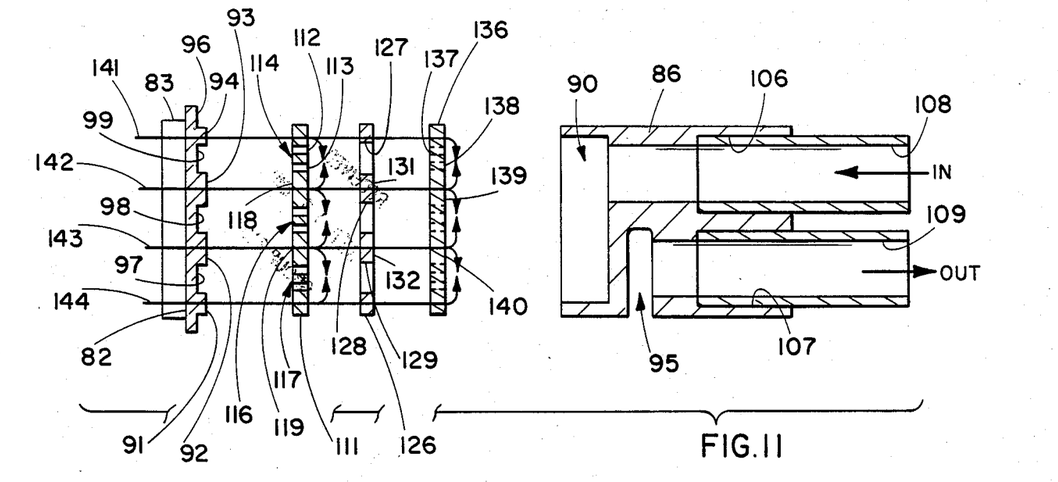
FIG. 11 is an exploded view of most of the major components of the preferred embodiment of the invention shown in FIG. 7.
Figure 12:
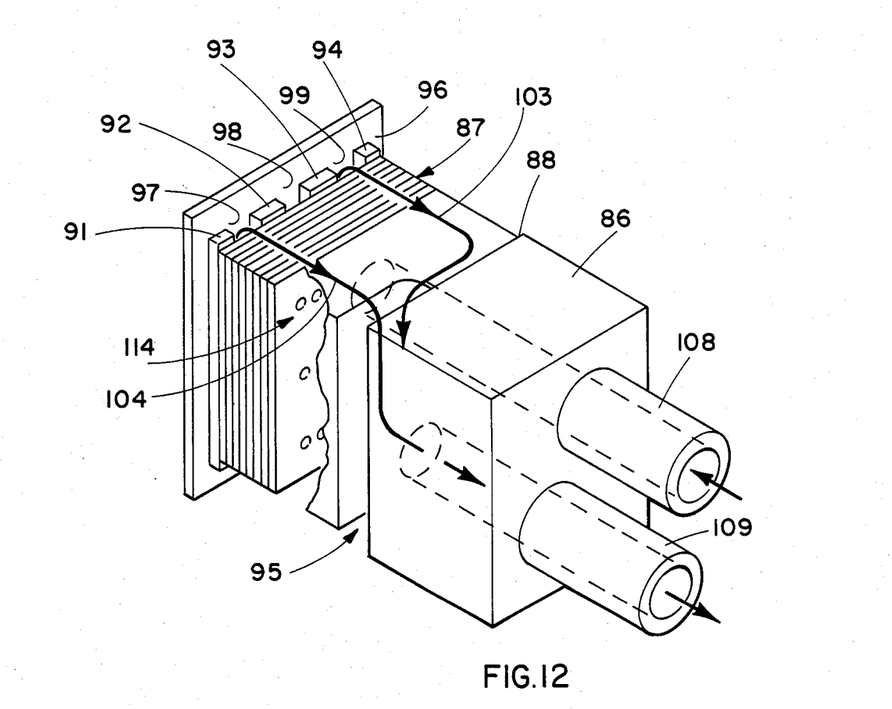
FIG. 12 is a three dimensional illustration of the compact high intensity cooler of FIG. 7 with its housing removed.

Accordingly, attention is now directed to FIG. 7 which shows a cross-section of a CHIC 81 which is a multiple impingement orifice plate embodiment of the invention. Details of the cooperation of the coolant and the stack of plates 87 will be readily comprehended when the description hereinafter is directed to FIG. 11. In FIG. 7, it will be seen that the CHIC 81 includes a target plate end piece 82 which has been bonded to a sleeve housing 84 at target plate peripheral flange 96. An end cap block 86 is positioned as shown within the housing 84, and is configured to present an inlet feed cavity 90 adjacent the stack of plates 87 as shown. The plates 87 are sandwiched between the target plate end piece 82 and end cap block 86. In the fabrication of the CHIC 81, the target plate end piece 82, the stack of plates 87, and the end cap block 86 are diffusion bonded into a unitary structure which has placed thereover sleeve housing 84 which is then brazed as shown at point 85 to the end cap block 86 and at the peripheral flange 96 to thereby establish a hermetically sealed housing. The end cap block 86 has a coolant inlet 106 and a drainage outlet 107, the arrangement of which can best be seen in FIG. 8. The end cap block 86 has a stepped down portion 80 which terminates at shoulder 88. The stepped down portion 80, and the sleeve housing 84 cooperate to form therebetween a drainage channel 89. For purposes of the description that follows reference to that portion of the compact high intensity cooler 81 where the channel 89 appears will be referred to as being the top of the CHIC 81. At the bottom of the CHIC 81 there will be seen another unreferenced channel. The cooperation of the drainage channel 89 and the drainage outlet 107 will better be understood when the description of FIG. 9 and FIG. 12 are presented hereinafter. The compact high intensity cooler 81 has a device 83 to be cooled integrally secured to the target plate end piece 82 in the manner described hereinbefore. There can be seen in FIG. 7, the dotted outline of guide pins 101 and 102 which are seated in unreferenced openings in raised portions 92 and 93 of the target plate end piece 82 (see FIG. 10). The guide pins 101 and 102 are utilized to secure the stack of plates 87 in an aligned arrangement during the fabrication of the CHIC 81.

Figure 10:
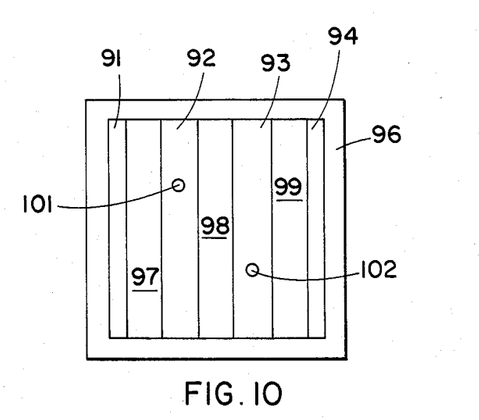
FIG. 10 is a view taken along the line A/A in FIG. 9.

When FIG. 7 and 10 are studied in conjunction with each other, it will be appreciated that the target plate end piece 82 is characterized by raised portions 91, 92, 93 and 94. The raised portions 91, 92, 93 and 94 create therebetween target plate slots 97, 98 and 99. Attention is now directed momentarily to FIG. 12, where these target plate slots 97, 98 and 99 can be seen in the three dimensional showing of FIG. 12.

Figure 8:
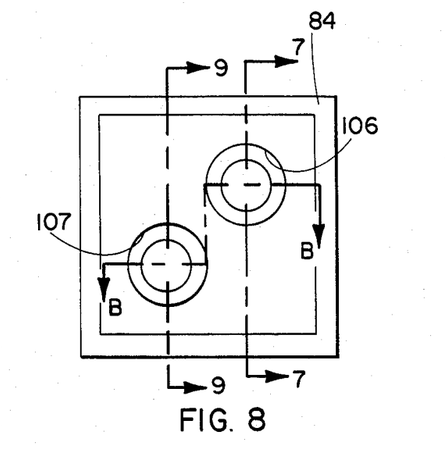
FIG. 8 is an end view of FIG. 7.
Figure 9:
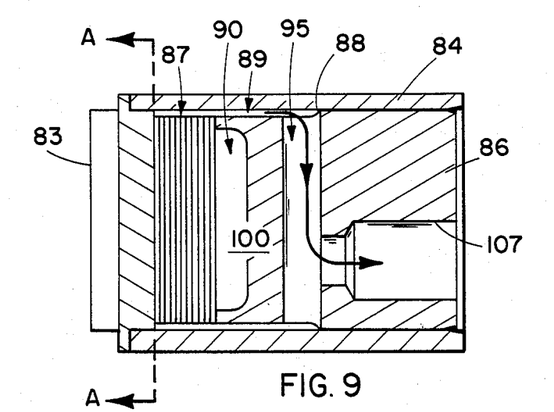
FIG. 9 is a cross-sectional view taken along the line 9—9 in FIG. 8.

FIG. 8 is an end view of the CHIC 81, and shows the CHIC configuration to be that of a square. It is to be noted, however, that the invention contemplates that the sleeve housing 84 may take on a circular cylindrical cross-section or such other cross-section that will ease fabrication or enhance the utilization of the impingement cooling arrangement therein.

Attention is now direction to FIG. 9. In this cross-section, taken along the line 9—9 of FIG. 8, one will be able to appreciate the presence of a drainage slot 95 which cooperates with the drainage channel 89 located at the top of the CHIC 81, as well as the unreferenced drainage channel at the bottom of the compact high intensity cooler. In FIG. 9 it will be seen that the shoulder 88 of the end cap 86 presents a point beyond which coolant being returned as shown by arrow 100 cannot pass. Attention is now directed momentarily to FIG. 12, where it should be readily apparent that coolant exiting from target plate slot 97 as evidenced by arrow 104 passes along the stack of plates 87, and thence into the drainage slot 95 where it ultimately, as shown by the arrow, exits from a drainage tube 109. In a similar fashion, coolant is shown as evidenced by arrow 103 leaving the target plate slot 99 and entering the drainage slot 95. Although not shown in FIG. 12, it will be appreciated that fluid also passes along the bottom of the stack 87 and enters the drainage slot 95.

Up until this point the manner in which the coolant entering inlet 106 passes to and through the inlet feed cavity 90, and thereafter the stack of plates 87 has not been described. The description that next follows is intended to illuminate the reader in respect of the dynamics of coolant flow through the stack, and the manner in which heat liberated from a device such as 83 is removed by fluid convection as the fluid passes through the stack of plates 87. To better understand the dynamics of the operation of the stack of plates 87 and the coolant that passes therethrough, attention is now directed to FIG. 11 which is an exploded view of some of the basic components of the compact high intensity cooler absent the sleeve housing 84. In this illustration only a few plates are shown and will be described. It is to be understood, however, that many more plates than that shown in FIG. 11 are in fact involved. For the most part the right hand portion of FIG. 11 has been described in some detail in respect of the description above as it pertained to FIGS. 7 through 10. In FIG. 11 there has been added an inlet tube 108 and a drainage tube 109 shown fitted respectively in coolant inlet 106 .

and drainage outlet 107. Commencing with a description next that begins at the left hand portion of FIG. 11, it will be seen that the device to be cooled, 83, is mounted on the target plate end piece 82, which as noted before has raised portions 91, 92, 93 and 94. Adjacent to the target plate end piece 82 and bonded thereto is an impingement orifice plate 111. The impingement orifice plate 111 has a number of orifices passing therethrough, two of which have been referenced by numerals 112 and 113. These orifices of which there are many more than two in the preferred embodiment, form a region referenced to as an impingement orifice zone. The impingement orifice plate 111 is provided with three such impingement orifice zones, namely those designated by reference numerals 114, 116 and 117. It is important to the understanding of the invention that the reader be aware that between the impingement orifice zones just described there is what is termed impingement heat plate conduction zones 118, 119, as well as two unreferenced impingement plate heat conduction zones at each end of the impingement orifice plate 111.

Adjacent and between the impingement orifice plates 111 and 136 is a spacer plate 126 which is provided with a set of slotted openings 127, 128 and 129, which are aligned such that the orifice opens in the impingement orifice plates just noted are such that coolant may pass freely through the openings 127, 128 and 129 as coolant moves through the impingement orifice plates in a manner that will be described shortly.

The spacer plate 126 has what is termed spacer plate heat conduction zones 131 and 132, as well as two unreferenced heat conduction zones at each end of the spacer plate 126.

The final impingement orifice plate 136 shown in FIG. 11 will now be described briefly, and it will be seen to possess what is termed non-aligned orifices 137 and 138 shown in dotted outline. By non-aligned, it is intended to mean that the orifices such as 137 and 138 are not aligned with the orifices 112 and 113 of the impingement orifice plate 111. In fact, none of the orifices shown in dotted outline in the impingement orifice plate 136 are in physical alignment with any of the openings shown in impingement orifice plate 111. The impingement orifice plate 136 is identical to, in all other respects, the impingement orifice plate 111, in that it has impingement plate heat conduction zones 139 and 140 and is referenced heat conduction zones at each end of the plate 111.

Super-imposed on the left hand portion of FIG. 11 are a set of conduction heat path arrows 141, 142, 143 and 144. If the reader envisions the arrangement shown in FIG. 11 as stacked as was described in respect of FIG. 7 through 10, then it will be readily comprehended that heat liberated from the device 83 will, for example, move along heat path 142 through target plate end piece 82, raised portion 93, thence through impingement plate conduction zone 118 where the heat as indicated by the super-imposed arrows will move outward therefrom along the impingement orifice plate 111. A portion of the heat will be conducted to and through the spacer plate heat conduction zone 131 and thereafter into the impingement orifice plate 136 in the manner shown by the super-imposed arrows. In order to maintain visual clarity of the details of impingement orifice plate 111, the heat conduction path arrows are shown positioned parallel to the plate. It is to be understood that the heat is conducted through the plate e.g. 111, and coolant impingement jets formed by the orifices in plate 136 impinge upon the heat transfer surfaces of the next succeeding plate.

As was requested above the reader is requested to continue envisioning the plate arrangements of FIG. 11 in a tightly stacked manner in their mind, as is the actual case shown in FIGS. 7 through 10. With this picture in mind, it will be seen that each of the impingement orifice plates represents a fin like structure separated by spacer plates with the entire arrangement thermally inter-connected via the aforementioned heat conduction zones. With this just described configuration of plates in mind, it should be readily apparent that coolant enters inlet tube 108 passes through end cap block 86 and enters the inlet feed cavity 90 and thereafter passes through, for example, the orifices 137 and 138, and thereafter passes through the opening 127 and impinges upon the surface of the impingement orifice plate 111. Because the volume of coolant is trapped between the plates which are sandwiches together, the coolant can exit only by passing through the impingement orifices 112 and 113, where they create impingement coolant jets that strike the target plate slot 99 of the target plate end piece 82. Each time the impinging fluid strikes a heat conduction surface, it removes a portion of the heat therefrom and coolant that has accomplished its cooling function then passes through the upper and lower ends of the slots 97, 98 and 99, and into the drainage channel such as 89 (see FIG. 7) and into the drainage slot 95 and exits via drainage outlet 107 (see FIG. 12). From the foregoing description, it should be readily understood that the invention contemplates that by alternating orifice plates and spacer plates, a series of impingement heat transfer surfaces may be added together, thereby increasing the effective heat transfer area considerably. It is to be recognized that the optimum number of plates will be a function of the number and size of holes in each plate and the allowable pressure drop.

Figure 13:
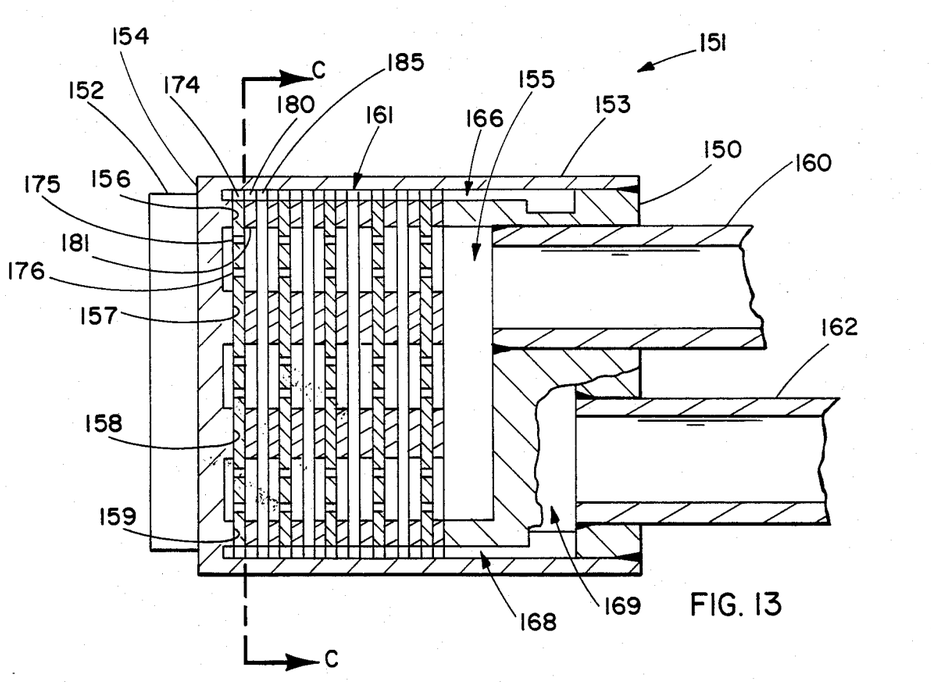
FIG. 13 is a cross-sectional showing of another multiple impingement plate embodiment of the invention.

Reference is now made to FIG. 13 which illustrates in cross-section another embodiment of the invention. Most of the elements of the embodiment of the invention depicted in FIG. 13 find their duplicate corresponding components in the just described preferred embodiment of the invention. As the description proceeds, however, it will be appreciated that the physical configuration of the various components are slightly modified in advantageous ways and provide alternates in the construction of the invention. These variations in construction are intended to be exemplary only of the modifications that may take place in the construction of a compact high intensity cooler that embodies the invention.

In FIG. 13 there is shown compact high intensity cooler 151 which has mounted on the end thereof a heat liberating device 152. The CHIC 151 has a housing 153 configured similar to that embodiment of the invention shown in FIG. 2. The housing 153 has what is designated a housing end 154. An end cap or block 150 is positioned within the housing 153. The end cap 150 is provided with an inlet feed cavity 155 which is coupled to the coolant inlet 160. A stack of plates 161 is shown sandwiched between the end cap 150 and the internal raised portions 156, 157, 158 and 159. In order to appreciate the operation of the CHIC shown in FIG. 13, attention should be simultaneously directed to the cross-sectional showing set forth in FIG. 14. For purposes of explanation only, when FIG. 13 is viewed as shown, the description will make reference to what will be termed the top and bottom of the CHIC 151. By the top, it is intended to mean that portion of the compact high intensity cooler 151 nearest the top of FIG. 13. With this thought in mind, it will be observed that there is present a top drainage channel 166, which is connected to and integral with a side drainage channel 167. The side drainage channel 167 can best be seen in FIG. 14. The CHIC 151 is also provided with a bottom drainage channel 168, which is referenced in both FIGS. 13 and 14. In a manner similar to that shown and described with respect to FIGS. 7 through 12, there is provided a drainage slot 169 which cooperates with drainage outlet 162. It will be understood that coolant enters inlet 160, passes through inlet feed channel 155 and then passes through the stack of plates 161 emerging at the points provided between the raised portions 156, 157, 158 and 159. The coolant thereafter as indicated by flow arrow 186 enters the side drainage slot 167. With attention directed to FIG. 14, it will be noted that there are a number of unreferenced arrows emanating from unreferenced orifice openings and these arrows are directed towards the sides of what have been described as drainage channels. Coolant fluid entering the drainage channels passes back pass the stack of plates 161 and into the drainage slot 169 and out drainage outlet 162, all without cross-flow with the coolant passing to and through the stack of plates 161.

Figure 14:
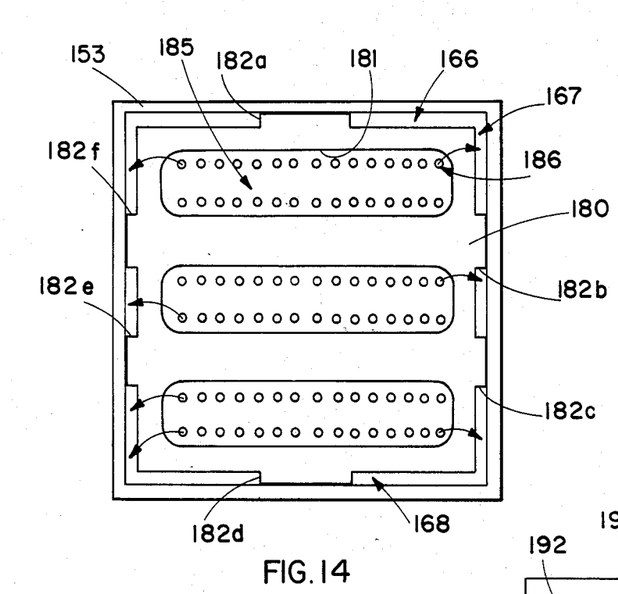
FIG. 14 is a view taken along the line C/C in FIG. 13.
Figure 16:
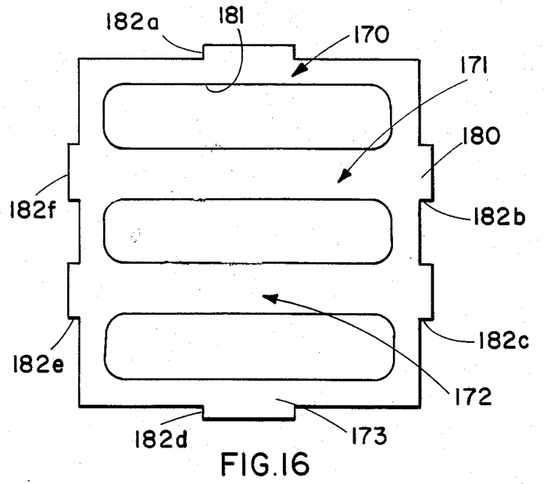
FIG. 16 is a spacer plate with positioning tabs employed in the invention embodiment of FIG. 13.

In FIG. 14 the outlines of three major components can be discerned. These components are as follows: the housing 153; a spacer plate 180, and an impingement orifice plate 185. The details of the spacer plate are shown in FIG. 16, where it will be noted that the spacer plate 180 is provided with openings such as opening 181 and spacer plate positioning tabs 182a, 182b, 182c, 182d, 182e and 182f. The spacer plate positioning tabs just noted are in alignment with impingement plate positioning tabs 190a, 190b, 190c, 190d, 190e and 190f. The use of positioning tabs allows the compact high intensity cooler 151 to be constructed without the use of centering pins as was the case in the preferred embodiment. The positioning tabs also function to define in combination with the housing 153, drainage return channels, which drainage return channels will be appreciated as being evenly distributed around the periphery of the stack of plates 161.

Figure 15:
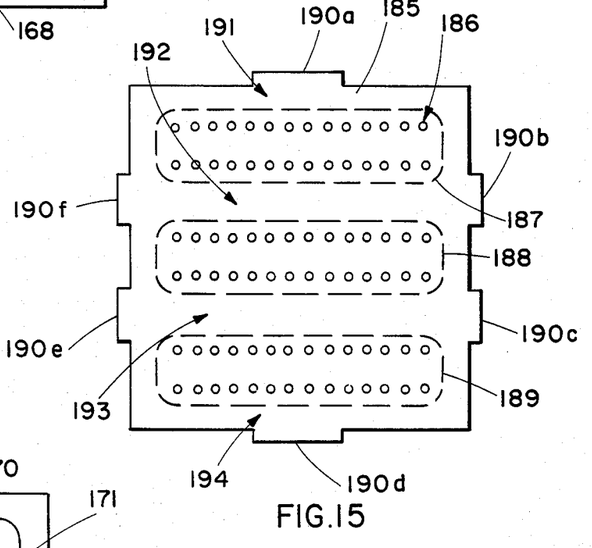
FIG. 15 is an impingement orifice plate with positioning tabs employed in the invention embodiment of FIG. 13.

The operation of this embodiment of the invention is basically the same as that described in respect of the preferred embodiment as shown in FIGS. 7 through 12. Accordingly, it will be noted that, for example, in FIG. 15, the impingement orifice plate 185 has in dotted outlines impingement orifice zones 187, 188 and 189. Between the impingement orifice zones just mentioned, there will be seen designated impingement plate heat conduction zones 191, 192 and 193 and 194.

In FIG. 16 between and adjacent the openings shown in the spacer plate 180 there are indicated spacer plate heat conduction zones 170, 171, 172 and 173.

Figures 17, 18:
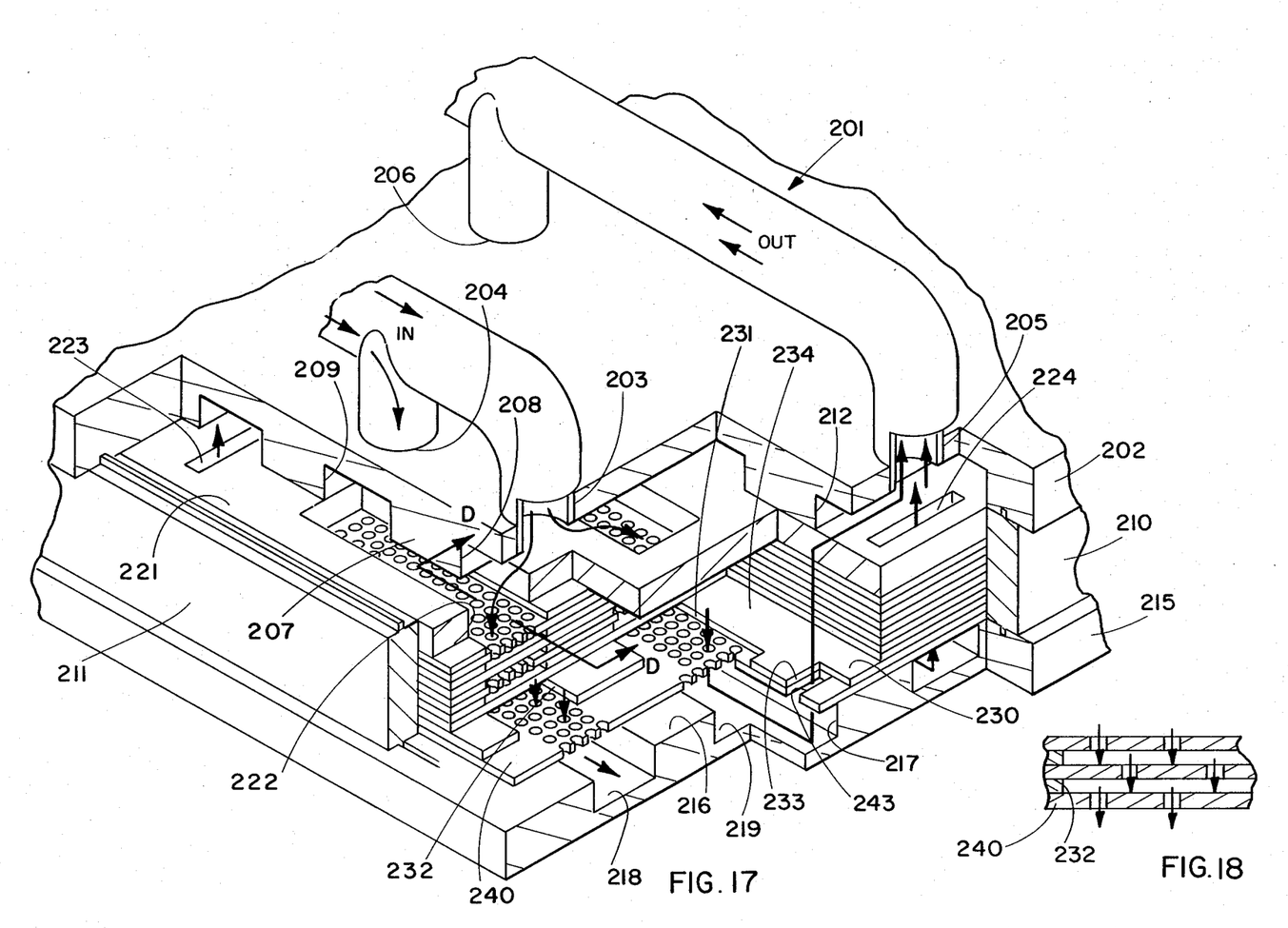
FIG. 17 illustrates yet another embodiment of the invention wherein multiple impingement plates are shown in a compact high intensity cooler that has been sectioned to depict the cooperative relationship of the components of the cooler.
FIG. 18 is a section taken along line D/D in FIG. 17.
Figure 19:
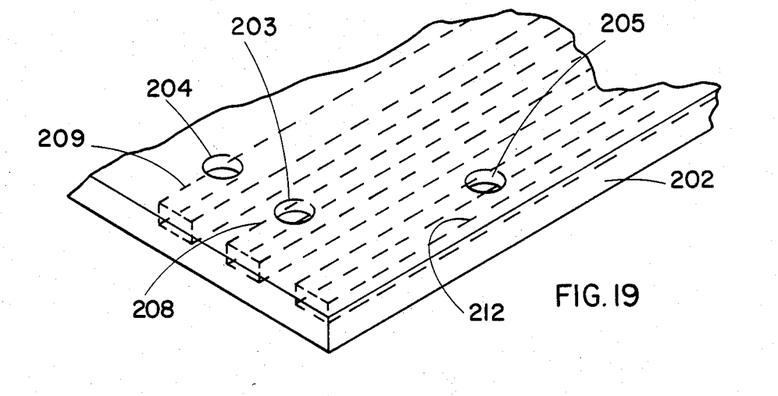
FIG. 19 is a three dimensional showing of a header plate employed in the embodiment of FIG. 17.

Reference is now made to FIGS. 17 through 23 which provide a detailed showing of yet another embodiment of the invention. In FIG. 17 there is illustrated in partial section, a three dimensional illustration of a large module CHIC 201. The theory of operation of the invention is the same in respect of the large module CHIC 201 of FIG. 17 as that which has been described in connection with the last two embodiments of the invention as set forth hereinbefore.

The description that follows will not be so much a description of the operation of the large module compact high intensity cooler 201 as it will be a description that will provide an indication of the identity of various facets of the construction of the large module compact high intensity cooler 201.

It will be noted that FIGS. 19 through 23 illustrate three dimensionally, a cooperating portion of each of the components of the component high intensity cooler 201 of FIG. 17. Identities have been given to each item or component of the CHIC 201 of FIG. 17. For example, there is a header plate 202 which can be seen in FIGS. 17 and 19. The header plate 202 is provided with coolant inlets 203 and 204, as well as drainage outlets 205, 206. The header plate 202 is also provided with, as can best be seen in FIG. 17, a load applying rib 207, which load applying rib 207 finds utility in the diffusion bonding construction step in the fabrication of the stack of plates shown immediately below the header plate 202. The coolant inlets 203 and 204 are shown coupled to coolant drainage channels 208 and 209. An unreferenced narrow varied ridge on the side wall members 210 and 211 is diffusion bonded to header plate 202 and target plate 215 when the complete assembly is bonded together during fabrication. A drainage channel 212 cooperates with drainage outlet 205 and its detail is shown in both FIGS. 17 and 19.

Figure 23:
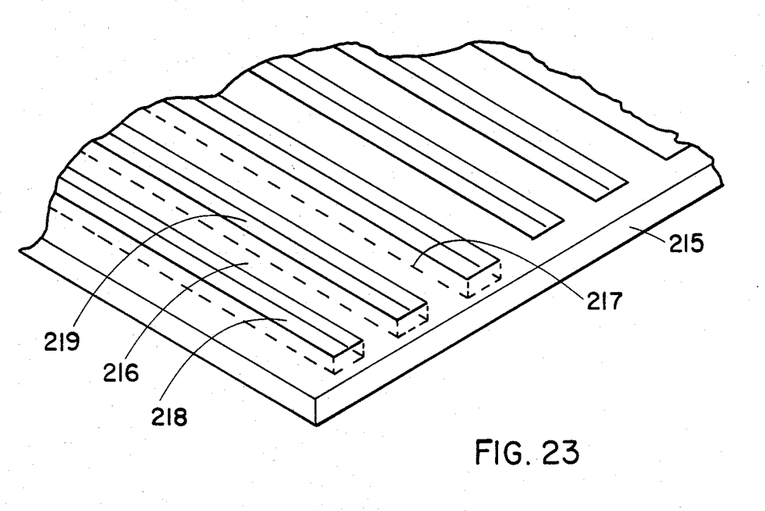
FIG. 23 is a three dimensional showing of a target plate employed in the embodiment of FIG. 17.

The target plate 215 just mentioned includes a plurality of raised portions 216 and 217. The raised portions 216 and 217 are identified in both FIGS. 17 and 23. FIG. 23 is intended to convey the details of construction of the target plate 215. The target plate 215 includes target plate slots 218 and 219 which cooperate with coolant fluid passing through the stack of plates from the inlet 203 as indicated by the unreferenced arrows.

Figure 20:
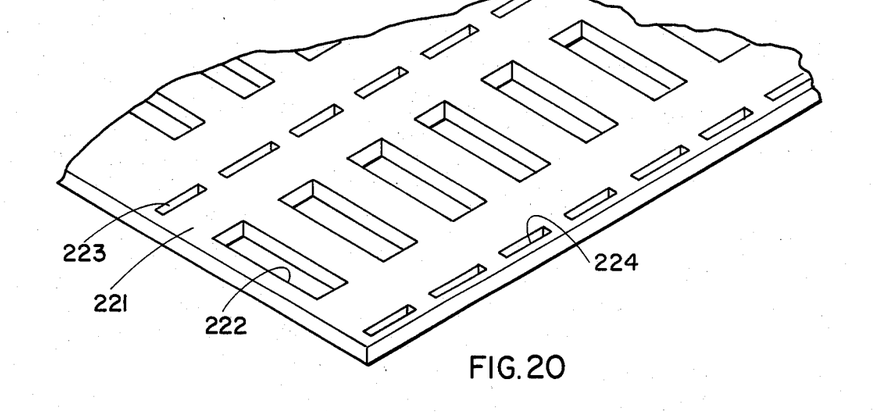
FIG. 20 is a three dimensional showing of an adaptor plate employed in the embodiment of FIG. 17.
Figure 21:
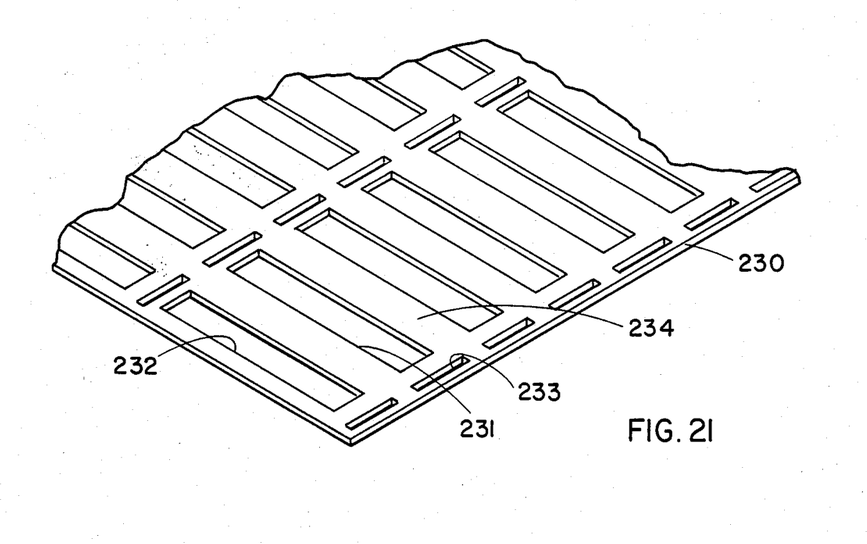
FIG. 21 is a three dimensional showing of a spacer plate employed in the embodiment of FIG. 17.
Figure 22:
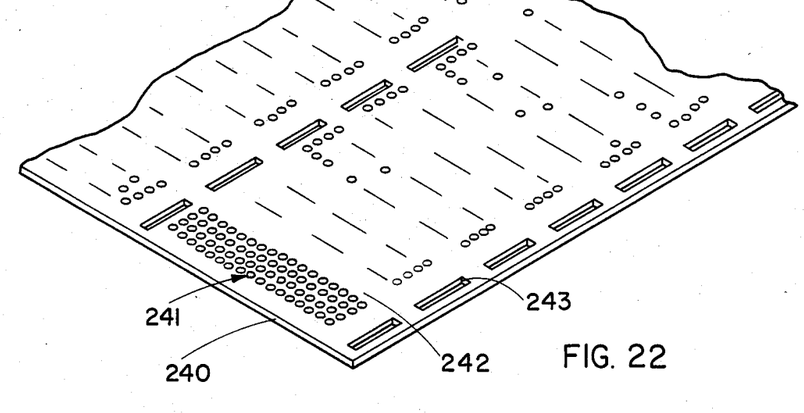
FIG. 22 is a three dimensional showing of an orifice plate employed in the embodiment of FIG. 17.

Immediately beneath the header plate 202 in FIG. 17 there will be observed an adaptor plate 221, the details of which are shown in FIG. 20 and include an adaptor plate opening 222 and a pair of adaptor plate return slots 223 and 224. Directly beneath the adaptor plate 221 there is shown a spacer plate 230, which spacer plate 230 and the details of its construction are shown in FIG. 21 and include a pair of spacer plate openings 231, 232, a spacer plate drainage opening 233, and a spacer plate heat conduction zone 234. The final component in the stack of plates is that referenced to as an orifice impingement plate 240, the details of which are shown in FIG. 22 and include an impingement orifice region 241, as well as an impingement plate heat conduction zone 242, and finally an impingement plate drainage return slot 243.

In FIG. 18 there is a partial section taken along the lines D/D in FIG. 17, and it will be observed that the unreferenced orifices of the stack of plates will be observed to be in non-aligned relationship with respect to coolant passing through the orifices as indicated by the arrows. The coolant impinges upon the space between the orifices on the next succeeding plate in the direction of coolant flow.

It should be apparent that the same heat conduction paths are present in this arrangement that have been described earlier and this last embodiment of the invention allows for the construction of large cooling modules that are compact and serve vast surfaces in respect of heat removal.

Although this invention has been illustrated and described in connection with the particular embodiment illustrated, it will be apparent to those skilled in the art that various changes may be made therein without departing from the spirit of the invention as set forth in the appended claims.

We claim:

1. An impingement cooling apparatus including a heat liberating device, the impingement cooling apparatus including in combination:
    a housing having an end of said housing in intimate contact with said device,
    a stack of plates fitted within and parallel to said housing end, one of said plates being an impingement orifice plate adjacent said end of said housing where said device is located, said orifice plate having impingement orifice regions characterized by coolant flow impingement orifices passing therethrough, said orifice plate having coolant drainage return means adjacent said impingement orifice regions,
    the remaining plates positioned adjacent said orifice plate and between said orifice plate and a coolant inlet means and a drainage means, each of said plates having at least one opening therethrough, each said opening cooperating with the opening on an adjacent plate to form an inlet channel means between said coolant inlet means and said orifice plate to thereby allow the establishment of a coolant flow path to said orifice plate to thereby supply coolant through said orifice to impinge at right angles upon said end of said housing to provide impingement cooling of said heat liberating device,
    said coolant being returned via said coolant drainage return means adjacent said impingement orifice regions and a return channel means from said orifice plate to said drainage means whereby a drainage flow path is established such that coolant after impinging upon said end of said housing passes back past said stack of plates to said drainage means and is free from cross-flow with said coolant flow path delivered through said inlet channel means to said impingement plate to thereby provide maximum heat transfer from said device to said coolant.

2. The impingement cooling apparatus of claim 1 wherein said housing is hermetically sealed.

3. The impingement cooling apparatus of claim 2 wherein said housing is made of a material having a high thermal conductivity.

4. The impingement cooling apparatus of claim 3 wherein said device is a high power electronic device.

5. The impingement cooling apparatus of claim 4 wherein said inlet and drainage means are both tubes.

6. The impingement cooling apparatus of claim 5 wherein said opening in said plate is of a slotted configuration.

7. The impingement cooling apparatus of claim 6 wherein said coolant drainage return means is formed by the cooperation of a portion of said stack of plates and said housing.

8. The impingement cooling apparatus of claim 1 wherein one of said remaining plates is another impingement orifice plate, said other impingement orifice plate having impingement orifice regions characterized by coolant flow impingement orifices passing therethrough,
    said orifices of said other impingement orifice plate being in a non-aligned relationship to said orifices of said one impingement orifice plate,
    said other impingement orifice plate having coolant drainage return means adjacent said impingement orifice regions.

9. The impingement cooling apparatus of claim 8 wherein said coolant drainage return means is formed by the cooperation of a portion of said stack of plates and said housing.

10. The impingement cooling apparatus of claim 8 wherein said coolant drainage return means of said one and said other impingement orifice plates are integral therewith.

11. The impingement cooling apparatus of claim 9 wherein there is included a spacer plate disposed between said impingement orifice plates, said spacer plate having opening therethrough cooperatively disposed to allow coolant to pass freely from the impingement orifice regions of said other impingement orifice plate to said impingement orifice regions of said one impingement orifice plate,
    said spacer plate cooperates with said housing to provide a drainage opening which is cooperatively disposed to allow coolant to be returned through said coolant drainage return means adjacent impingement orifice regions and said drainage opening.

12. The impingement cooling apparatus of claim 11 wherein said spacer plate has spacer plate heat conduction zones, said spacer plate heat conduction zones providing a heat conduction path from one side of said spacer plate to another side of said spacer plate.

13. The impingement cooling apparatus of claim 12 wherein said end of said housing has internally disposed raised portions which physically cooperate with an impingement plate heat conduction zone of said one impingement orifice plate.

14. The impingement cooling apparatus of claim 13 wherein each of said impingement orifice plates has impingement plate heat conduction zones between said impingement orifice regions, said impingement plate heat conduction zones being in alignment with said raised portions of said end of said housing and said spacer plate heat conduction zones,
    at least one of said raised portions of said housing being thermally coupled to one of said impingement plate heat conduction zones to thereby allow heat paths to be developed from said housing end through said raised portions, said impingement plate heat conduction zones and said spacer plate heat conduction zones whereby heat liberated by said device is removed by the impingement of said coolant on said one impingement orifice plate and by impingement of said coolant upon said housing end.

15. An impingement cooling apparatus including a heat liberating device, the impingement cooling apparatus including in combination:
    a heat transmitting means positioned between said heat liberating device and a first impingement orifice means,
    said first impingement orifice means positioned in a plane parallel to said heat transmitting means and having an orifice passing therethrough, said first impingement orifice means being thermally, mutually coupled to said heat transmitting means and a second impingement orifice means,
    said first impingement orifice means having portions thereof spaced apart from said heat transmitting means and said second impingement orifice means to thereby cause heat liberated from said device to be conducted through said heat transmitting means to said first and second impingement orifice means, said second impingement orifice means having an orifice therethrough that is in non-aligned relationship with said orifice of said first impingement means, means to deliver coolant in a path to and through said orifice of said second impingement means at a right angle to said first impingement means and thereafter to and through said orifice of said first impingement means whereupon said coolant impinges at a right angle to and upon said heat transmitting means, drainage means coupled to said heat transmitting means and said first and second impingement orifice means to thereby provide an isolated coolant return path of coolant that has come in impinging contact with said heat conducted from said device via said heat transmitting means and said first impingement orifice means, said coolant return path located such that said coolant passes back past said first and second impingement orifice means and is free from cross-flow with said coolant delivery path to thereby provide maximum heat transfer from said device to said coolant.

16. The impingement cooling apparatus of claim 15 wherein said heat transmitting means is a housing that has an end thereof in intimate contact with said device.

17. The impingement cooling apparatus of claim 16 wherein said first and second impingement orifice means each have plate like configuration.

18. The impingement cooling apparatus of claim 17 includes in combination a spacer plate positioned between said first and second impingement orifice means plate.

19. The impingement cooling apparatus of claim 18 wherein said spacer plate and said first and second impingement orifice means plates are in a stacked arrangement and fitted within said housing.

20. The impingement cooling apparatus of claim 19 wherein said first and second impingement orifice means plates each have integral therewith coolant drainage return means adjacent respectively said orifice of said first impingement orifice means plate and said orifice of said second impingement orifice means plate.

21. The impingement cooling apparatus of claim 20 wherein said spacer plate has first and second openings therethrough such that coolant which passes through said orifice of said second impingement orifice means plate passes through said first opening of said spacer plate, and said second opening is disposed adjacent said coolant drainage return means of said first and second impingement orifice means plates.

22. The impingement cooling apparatus of claim 21 wherein said housing is made of a material having a high thermal conductivity.

23. The impingement cooling apparatus of claim 22 wherein said device is a high power electronic device.

24. The impingement cooling apparatus of claim 23 wherein said spacer plate has spacer plate heat conduction zones between said openings, said spacer plate heat conduction zones providing a heat conduction path from one side of said spacer plate to another side of said spacer plate.

25. The impingement cooling apparatus of claim 24 wherein said end of said housing has internally disposed raised portions which physically cooperate with an impingement plate heat conduction zone of said first impingement orifice means plate.

26. The impingement cooling apparatus of claim 25 wherein each of said impingement orifice means plates has impingement plate heat conduction zones between said orifices, said impingement plate heat conduction zones in alignment with said raised portions of said end of said housing and said spacer plate heat conduction zones, at least one of said raised portions thermally coupled to one of said impingement plate heat conduction zones to thereby allow heat paths to be developed from said housing end through said raised portions, said impingement plate heat conduction zones and said spacer plate heat conduction zones whereby heat liberated by said device is removed by the impingement of said coolant on at least one of said impingement orifice plates and by impingement of said coolant upon said housing end.

27. An impingement cooling apparatus including a heat liberating device, said apparatus including in combination:

a stacked series of heat transfer surface fins, thermally coupled by conduction means to said device at one end of said stacked series of fins, each of said fins having an orifice passing therethrough, said fin orifices each being in non-alignment with the orifice of an adjacent fin, means to provide coolant to and through said fin orifices in a direction towards said device to thereby cause said coolant passing through said orifices to impinge upon the next fin encountered in the direction of coolant flow and finally upon said conduction means, said coolant being returned via a coolant drainage return means adjacent said stacked series of heat transfer surface fins and a return channel means from said conduction means to said drainage means whereby a drainage flow path is established such that coolant after impinging upon said conduction means passes back past said stack of plates to said drainage means and is free from cross-flow with said coolant flow path delivered through said inlet channel means to said impingement plate to thereby provide maximum heat transfer from said device to said coolant.

28. The cooling apparatus of claim 27 which includes in combination a thermally conductive housing which surrounds said stacked series of heat transfer surface fins, said housing having an internal end in intimate contact with an end of said stacked fins to provide said conduction means, said device being secured externally of said housing to the same end of said housing as that which said axially stacked fins make said intimate contact.

29. An impingement cooling apparatus including a heat liberating device which includes in combination:

a primary heat transmitting means having a surface in a plane, said heat transmitting means respectively coupled to said device and a heat transfer surface means having a plurality of surface means disposed in planes parallel to said heat transmitting means wherein a source of coolant is delivered in a path to said surface means in the form of impinging jets by way of arrays of submerged fluid jets which flow onto said surface means and through orifice means within said surface means, and finally at right angles upon said heat transmitting means, said coolant being returned via a coolant drainage return means adjacent said plurality of heat transfer surface means and a return channel means from said orifice plate to said drainage means whereby a drainage flow path is established such that coolant after impinging upon said heat transmitting means passes back past said plurality of heat transfer surface means to said drainage means and is free from cross-flow with said coolant flow path delivered through said arrays of submerged fluid jets to said heat transmitting means to thereby provide maximum heat transfer from said device to said coolant.

30. The impingement cooling apparatus of claim 29 wherein said plurality of surface means is comprised of axially stacked fins each of which is spaced apart by a heat conducting material, each of said fins having said orifice means integral therewith to thereby allow passage of coolant through said fin, an end of said axial stacked fins physically coupled to said primary heat transmitting means.

31. The impingement cooling apparatus of claim 30 wherein said arrays of submerged jets are created by said orifices in said fins by the supply of coolant under pressure from said source through said orifices in said fins, whereupon said coolant impinges upon a subsequent fin thereby producing high heat transfer coeficients between said coolant and said fins.

32. The impingement cooling apparatus of claim 31 wherein said orifice in any given fin is in a non-aligned relationship to an orifice in an adjacent fin in the direction the coolant is being delivered.

33. The impingement cooling apparatus of claim 32 wherein said surface means are formed of a plurality of parallel surfaces.

* * * * *